United States Patent
Hori et al.

(10) Patent No.: US 10,427,324 B2
(45) Date of Patent: Oct. 1, 2019

(54) SILICON CARBIDE INGOT AND METHOD FOR MANUFACTURING SILICON CARBIDE SUBSTRATE

(71) Applicant: SUMITOMO ELECTRIC INDUSTRIES, LTD., Osaka-shi, Osaka (JP)

(72) Inventors: Tsutomu Hori, Itami (JP); Makoto Sasaki, Itami (JP); Tsubasa Honke, Itami (JP); Tomohiro Kawase, Itami (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 377 days.

(21) Appl. No.: 15/027,059

(22) PCT Filed: Oct. 14, 2014

(86) PCT No.: PCT/JP2014/077304
§ 371 (c)(1),
(2) Date: Apr. 4, 2016

(87) PCT Pub. No.: WO2015/076037
PCT Pub. Date: May 28, 2015

(65) Prior Publication Data
US 2016/0236375 A1    Aug. 18, 2016

(30) Foreign Application Priority Data
Nov. 20, 2013 (JP) ................. 2013-239995

(51) Int. Cl.
*B28D 5/04* (2006.01)
*C30B 29/36* (2006.01)
(Continued)

(52) U.S. Cl.
CPC .......... *B28D 5/045* (2013.01); *B24B 27/0633* (2013.01); *C30B 23/02* (2013.01);
(Continued)

(58) Field of Classification Search
None
See application file for complete search history.

(56) References Cited

U.S. PATENT DOCUMENTS 9,546,437 B2 *   1/2017   Hori ................ C30B 29/36
9,732,436 B2 *   8/2017   Shirai .............. C30B 29/36
(Continued)

FOREIGN PATENT DOCUMENTS

JP   2005-008473 A    1/2005
JP   2006-290635      10/2006
(Continued)

OTHER PUBLICATIONS

Machine translation of JP 2005-008473 A, retrieved Jun. 2018. (Year: 2018).*

Primary Examiner — Nicole M. Buie-Hatcher
(74) Attorney, Agent, or Firm — IPUSA, PLLC

(57) ABSTRACT

A silicon carbide ingot includes an end surface and an end surface opposite to the end surface. In the silicon carbide ingot, the end surface and the end surface face each other in a growth direction, and a gradient of a nitrogen concentration in the growth direction is not less than $1\times10^{16}$ cm$^{-4}$ and not more than $1\times10^{18}$ cm$^{-4}$.

9 Claims, 3 Drawing Sheets

(51) Int. Cl.
*B24B 27/06* (2006.01)
*C30B 23/02* (2006.01)
*C30B 33/06* (2006.01)
*C30B 33/00* (2006.01)

(52) U.S. Cl.
CPC ............ *C30B 23/025* (2013.01); *C30B 29/36* (2013.01); *C30B 33/00* (2013.01); *C30B 33/06* (2013.01)

(56) References Cited

U.S. PATENT DOCUMENTS

| | | | |
|---|---|---|---|
| 2007/0209577 A1* | 9/2007 | Powell | C30B 23/00 117/87 |
| 2010/0295059 A1* | 11/2010 | Fujimoto | C30B 23/00 257/77 |
| 2011/0206929 A1* | 8/2011 | Nakabayashi | C30B 23/00 428/367 |
| 2012/0315427 A1* | 12/2012 | Hori | C30B 23/00 428/64.1 |
| 2013/0061801 A1 | 3/2013 | Fujiwara et al. | |

FOREIGN PATENT DOCUMENTS

| | | | |
|---|---|---|---|
| JP | 2008-074663 | 4/2008 | |
| JP | 2010-023208 A | 2/2010 | |
| JP | 2010-095397 | 4/2010 | |
| JP | 2013-060328 A | 4/2013 | |
| JP | 2013-169635 A | 9/2013 | |
| WO | WO-2013183368 A1 * | 12/2013 | ............ C30B 29/36 |

* cited by examiner

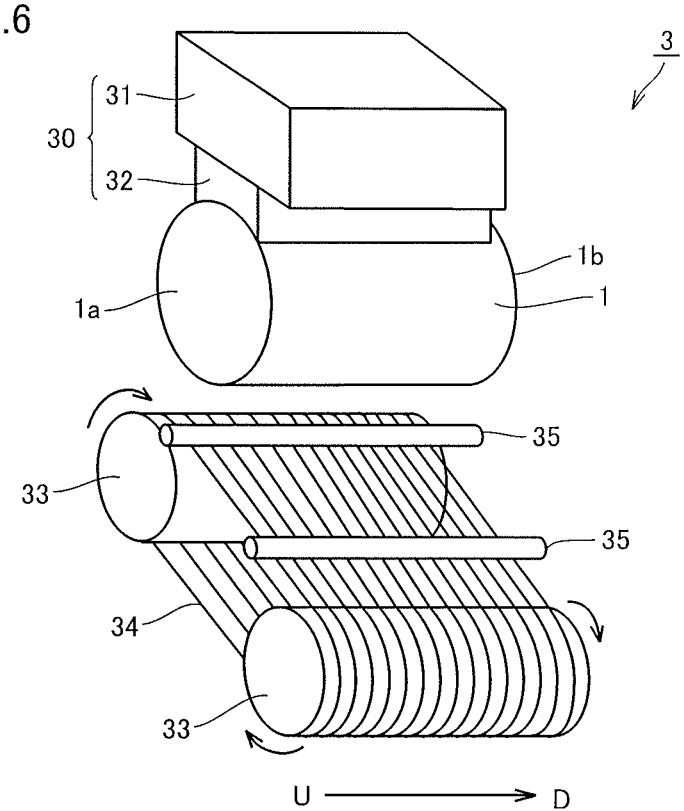

SILICON CARBIDE INGOT AND METHOD FOR MANUFACTURING SILICON CARBIDE SUBSTRATE

TECHNICAL FIELD

The present invention relates to a silicon carbide ingot and a method for manufacturing a silicon carbide substrate.

BACKGROUND ART

Conventionally, a silicon carbide ingot has been cut using a wire saw according to a loose abrasive grain method. For example, Japanese Patent Laying-Open No. 2010-23208 discloses a method of cutting a workpiece using slurry including GC grains. On the other hand, in recent years, a silicon carbide ingot has been also cut using a wire saw according to a fixed abrasive grain method. Accordingly, as compared with a case where the loose abrasive grain method is employed, cost can be significantly reduced in the step of cutting a silicon carbide ingot.

CITATION LIST

Patent Document

PTD 1: Japanese Patent Laying-Open No. 2010-23208

SUMMARY OF INVENTION

Technical Problem

Even when the fixed abrasive grain method is employed to cut a silicon carbide ingot as described above so as to obtain a substrate having a large diameter, warpage of the substrate can be suppressed to some extent. However, a plurality of substrates obtained from one silicon carbide ingot may include: substrates each having small warpage; and substrates each having large warpage and not suitable for practical use.

The present disclosure has an object to provide: a silicon carbide ingot allowing for suppression of warpage of a substrate when cutting it using a wire saw according to the fixed abrasive grain method; and a method for manufacturing a silicon carbide substrate using the silicon carbide ingot.

Solution to Problem

A silicon carbide ingot according to one embodiment of the present invention includes a first end surface and a second end surface opposite to the first end surface. In the silicon carbide ingot, the first end surface and the second end surface face each other in a growth direction, and a gradient of a nitrogen concentration in the growth direction is not less than $1 \times 10^{16}$ cm$^{-4}$ and not more than $1 \times 10^{18}$ cm$^{-4}$.

Advantageous Effects of Invention

According to one embodiment of the present invention, there can be provided: a silicon carbide ingot allowing for suppression of warpage of a substrate when cutting it using a wire saw according to the fixed abrasive grain method; and a method for manufacturing a silicon carbide substrate using the silicon carbide ingot.

BRIEF DESCRIPTION OF DRAWINGS

FIG. 6 is a schematic perspective view showing the structure of a wire saw used in the method for manufacturing the silicon carbide substrate according to the present embodiment.

DESCRIPTION OF EMBODIMENTS

Figure 1:
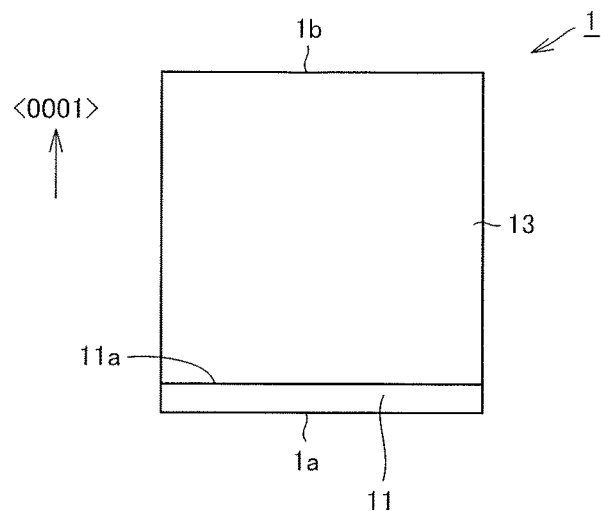
FIG. 1 is a schematic front view showing a silicon carbide ingot according to the present embodiment.

Description of Embodiments of the Invention of the Present Application

First, details of embodiments of the present invention are listed and described.

(1) A silicon carbide ingot (1) according to the present embodiment includes a first end surface (1a) and a second end surface (1b) opposite to the first end surface (1a). In the silicon carbide ingot (1), the first end surface (1a) and the second end surface (1b) face each other in a growth direction, and a gradient of a nitrogen concentration in the growth direction is not less than $1 \times 10^{16}$ cm$^{-4}$ and not more than $1 \times 10^{18}$ cm$^{-4}$.

In the silicon carbide ingot (1), the gradient of the nitrogen concentration in the growth direction is high such as not less than $1 \times 10^{16}$ cm$^{-4}$. Accordingly, when cutting the silicon carbide ingot (1) by causing a wire having an abrasive grain fixed thereon to travel in contact with the silicon carbide ingot (1) at a plurality of cut portions lined up in the growth direction, the warpage of each substrate can be suppressed irrespective of the locations of the plurality of cut portions. Moreover, in the silicon carbide ingot (1), the gradient of the nitrogen concentration in the growth direction is suppressed to not more than $1 \times 10^{18}$ cm$^{-4}$. Accordingly, a crack can be suppressed from being generated in the crystal due to the gradient of the nitrogen concentration being otherwise too large. Therefore, according to the silicon carbide ingot (1), the warpage of the substrate can be suppressed when cutting it using a wire saw according to the fixed abrasive grain method.

(2) The silicon carbide ingot (1) has a width of not less than 100 mm when viewed in the growth direction. When the width of the silicon carbide ingot (1) is large, the width of the silicon carbide substrate (10) obtained by cutting it also becomes large. When the width of the silicon carbide substrate (10) is large, the substrate is more likely to be warped. Accordingly, when the width of the silicon carbide ingot (1) is not less than 100 mm when viewed in the growth direction, an effect of suppressing the warpage of the substrate becomes larger.

(3) In the silicon carbide ingot (1), the nitrogen concentration is changed monotonously in the growth direction. This facilitates adjustment of flow rate of nitrogen gas during manufacturing of the silicon carbide ingot (1). It should be noted that the expression "the nitrogen concentration is changed monotonously in the growth direction" is intended to indicate a case where the nitrogen concentration is increased or decreased linearly to have a constant inclination in the growth direction.

(4) In the silicon carbide ingot (1), one of the first end surface (1a) and the second end surface (1b) is a surface including a (000-1) plane. Accordingly, the silicon carbide single crystal can be readily grown in the c axis direction during manufacturing of the silicon carbide ingot (1).

(5) A method for manufacturing a silicon carbide substrate according to the present embodiment includes steps of: preparing the silicon carbide ingot (1); and obtaining a silicon carbide substrate (10) by cutting the silicon carbide ingot (1).

In the silicon carbide ingot (1), the gradient of the nitrogen concentration in the growth direction is high such as not less than $1 \times 10^{16}$ cm$^{-4}$. Accordingly, when cutting the silicon carbide ingot (1) by causing a wire having an abrasive grain fixed thereon to travel in contact with the silicon carbide ingot (1) at a plurality of cut portions lined up in the growth direction, the warpage of each substrate can be suppressed irrespective of the locations of the plurality of cut portions. Moreover, in the silicon carbide ingot (1), the gradient of the nitrogen concentration in the growth direction is suppressed to not more than $1 \times 10^{18}$ cm$^{-4}$. Accordingly, a crack can be suppressed from being generated in a substrate obtained by cutting the silicon carbide ingot (1). Therefore, according to the method for manufacturing the silicon carbide substrate according to the present embodiment, the warpage of the substrate can be suppressed when the silicon carbide ingot is cut using a wire saw according to the fixed abrasive grain method.

(6) In the method for manufacturing the silicon carbide substrate, in the step of obtaining the silicon carbide substrate (10), the silicon carbide ingot (1) is cut by causing a wire (34) to travel in contact with the silicon carbide ingot (1) at a plurality of cut portions lined up in the growth direction, the wire (34) having a surface to which an abrasive grain is fixed. When the fixed abrasive grain method is thus employed to cut the silicon carbide ingot (1), the warpage of the substrate can be suppressed as described above.

(7) In the method for manufacturing the silicon carbide substrate, the nitrogen concentration in a portion of the silicon carbide ingot (1) at the second end surface (1b) side is higher than the nitrogen concentration in a portion of the silicon carbide ingot (1) at the first end surface (1a) side. Moreover, a second cut portion located at the second end surface (1b) side among the plurality of cut portions is in contact with a portion of the wire (34) at a downstream side in the travel direction as compared with a first cut portion located at the first end surface (1a) side among the plurality of cut portions.

The portion of the wire (34) at the downstream side has a larger degree of deterioration than that of a portion of the wire (34) at an upstream side, and a substrate obtained through cutting by the portion of the wire at the downstream side is therefore more likely to have warpage. To address this, the portion of the wire at the downstream side is brought into contact with the cut portion located at the second end surface (1b) side with a high nitrogen concentration, thereby further suppressing the warpage of the substrate.

(8) In the method for manufacturing the silicon carbide substrate, the abrasive grain includes a diamond abrasive grain. By using the wire to which such a hard abrasive grain is fixed, the silicon carbide ingot (1) can be cut more efficiently.

(9) In the method for manufacturing the silicon carbide substrate, in the step of obtaining the silicon carbide substrate (10), the silicon carbide ingot (1) is cut to provide the silicon carbide substrate (10) with a thickness of not more than 1 mm.

When the thickness of the silicon carbide substrate (10) is small, the substrate is more likely to be warped. Accordingly, when the silicon carbide ingot (1) is cut to provide the silicon carbide substrate (10) with a thickness of not more than 1 mm, the effect of suppressing the warpage of the substrate becomes larger.

Details of Embodiments of the Invention of the Present Application

Next, specific examples of the embodiments of the present invention will be described with reference to figures. It should be noted that in the below-mentioned figures, the same or corresponding portions are given the same reference characters and are not described repeatedly. Further, in the present specification, an individual orientation is represented by [ ], a group orientation is represented by < >, and an individual plane is represented by ( ), and a group plane is represented by { }. In addition, a negative index is supposed to be crystallographically indicated by putting "-" (bar) above a numeral, but is indicated by putting the negative sign before the numeral in the present specification.

Described first are a silicon carbide ingot and a silicon carbide substrate according to the present embodiment. With reference to FIG. 1, a silicon carbide ingot 1 is made of silicon carbide having a polytype of 4H type, and mainly has a seed substrate 11 and a silicon carbide layer 13. Silicon carbide ingot 1 has an end surface 1a (first end surface) at the seed substrate 11 side, and an end surface 1b (second end surface) at the silicon carbide layer 13 side. Silicon carbide layer 13 includes nitrogen (N) atoms, and is formed by growing it on surface 11a of seed substrate 11 by way of a sublimation recrystallization method. The growth direction of silicon carbide layer 13 (direction in which end surface 1a and end surface 1b face each other) corresponds to a <0001> direction, and end surface 1b, which is a growth surface, is constituted of a (000-1) plane. Moreover, with reference to FIG. 2, a silicon carbide substrate 10 according to the present embodiment is obtained by cutting silicon carbide ingot 1 (see FIG. 1) in an appropriate direction. It should be noted that FIG. 1 shows silicon carbide ingot 1 having seed substrate 11 and silicon carbide layer 13; however, seed substrate 11 may be removed in silicon carbide ingot 1.

Figure 2:
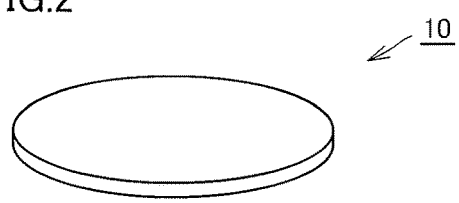
FIG. 2 is a schematic perspective view showing a silicon carbide substrate according to the present embodiment.

With reference to FIG. 1, silicon carbide ingot 1 has a thickness of not less than 10 mm in the growth direction, for example. Silicon carbide ingot 1 has a width of not less than 100 mm, preferably, not less than 150 mm when viewed in the growth direction. With reference to FIG. 2, silicon carbide substrate 10 has a thickness of not more than 1 mm. The width of silicon carbide substrate 10 is not less than 100 mm (not less than 4 inches), preferably, not less than 150 mm (not less than 6 inches), as with the width of silicon carbide ingot 1.

With reference to FIG. 1, silicon carbide layer 13 has a nitrogen concentration of, for example, not less than $1 \times 10^{-4}$ cm$^{-3}$ and not more than $3 \times 10^{19}$ cm$^{-3}$, preferably, not less than $1 \times 10^{17}$ cm$^{-3}$ and not more than $2 \times 10^{19}$ cm$^{-3}$. In silicon carbide layer 13, a gradient of the nitrogen concentration in the growth direction is not less than $1 \times 10^{16}$ cm$^{-4}$ and not more than $1 \times 10^{18}$ cm$^{-4}$, preferably, not less than $1 \times 10^{17}$ cm$^{-4}$ and not more than $1 \times 10$ cm$^{-4}$, more preferably, not less than $5 \times 10^{17}$ cm$^{-4}$ and not more than $1 \times 10^{18}$ cm$^{-4}$.

Figure 3:
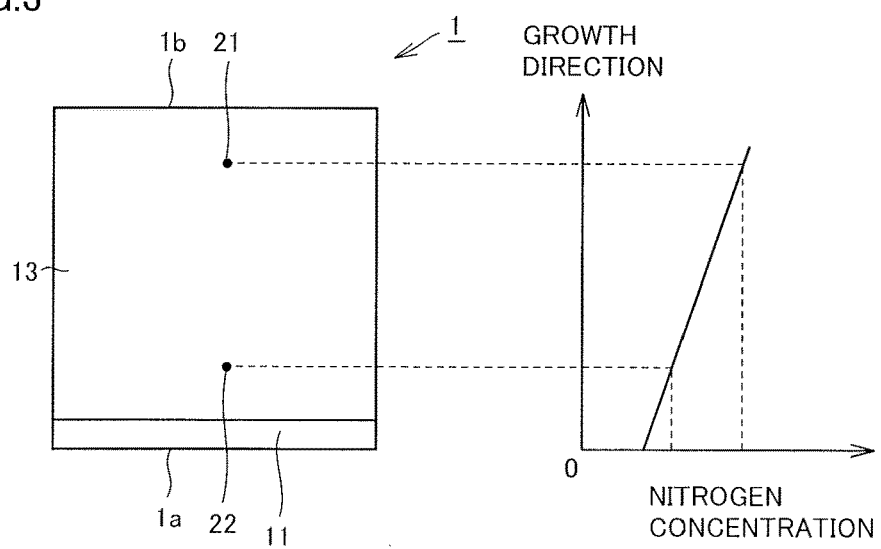
FIG. 3 is a schematic view for illustrating a method for calculating a gradient of a nitrogen concentration in the silicon carbide ingot according to the present embodiment.

The gradient of the nitrogen concentration of silicon carbide ingot 1 in the growth direction can be calculated as follows. With reference to FIG. 3, first, it is assumed that in silicon carbide layer 13, a first measurement point 21 represents a point distant from end surface 1b by 2 mm in the growth direction, and a second measurement point 22 represents a point distant from first measurement point 21 by 5 mm in the growth direction. First measurement point 21 and second measurement point 22 include the central portion of silicon carbide ingot 1 in the radial direction. Next, the nitrogen concentration ($cm^{-3}$) is measured at each of first measurement point 21 and second measurement point 22. The nitrogen concentration is measured by secondary ion mass spectroscopy (SIMS), for example. Then, the absolute value of a difference ($cm^{-3}$) between the nitrogen concentration measured at first measurement point 21 and the nitrogen concentration measured at second measurement point 22 is divided by the distance (0.5 cm) between first measurement point 21 and second measurement point 22. In this way, the gradient ($cm^{-4}$) of the nitrogen concentration of silicon carbide ingot 1 in the growth direction can be calculated.

In silicon carbide ingot 1, as shown schematically in a graph of FIG. 3, the nitrogen concentration is changed monotonously in the growth direction. More specifically, the nitrogen concentration is linearly increased from the end surface 1a side to the end surface 1b side. Thus, the nitrogen concentration in a portion of silicon carbide ingot 1 at the end surface 1b side is larger than the nitrogen concentration in a portion of silicon carbide ingot 1 at the end surface 1a side. It should be noted that in the graph of FIG. 3, the horizontal axis represents the nitrogen concentration and the vertical axis represents the growth direction.

Next, the following describes a method for manufacturing the silicon carbide ingot and the silicon carbide substrate according to the present embodiment. In the method for manufacturing the silicon carbide ingot and the silicon carbide substrate according to the present embodiment, silicon carbide ingot 1 and silicon carbide substrate 10 are obtained in a manner described below.

Figure 4:
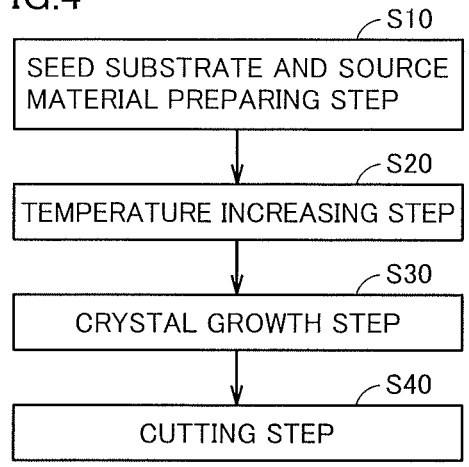
FIG. 4 is a flowchart schematically showing a method for manufacturing the silicon carbide ingot and the silicon carbide substrate according to the present embodiment.
Figure 5:
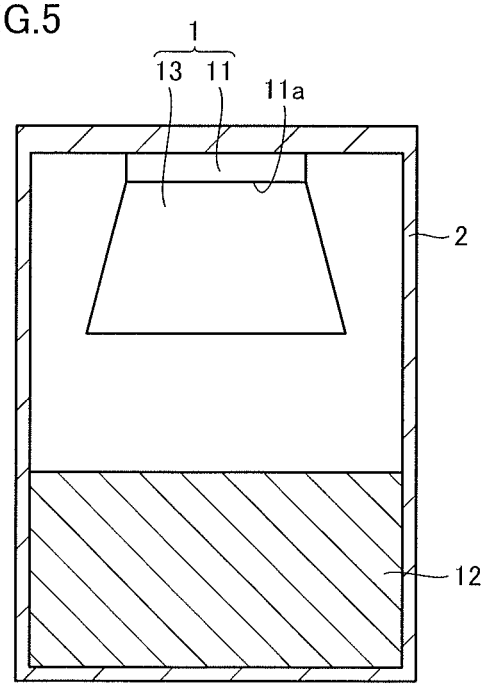
FIG. 5 is a schematic cross sectional view for illustrating the method for manufacturing the silicon carbide ingot according to the present embodiment.

With reference to FIG. 4, a seed substrate and source material preparing step is first performed as a step (S10). In this step (S10), with reference to FIG. 5, seed substrate 11 formed of a silicon carbide single crystal and a source material 12 formed of polycrystal silicon carbide powders or a silicon carbide sintered compact are prepared first. Seed substrate 11 and source material 12 are placed face to face with each other in a crucible 2 formed of carbon as shown in FIG. 5.

Next, a temperature increasing step is performed as a step (S20). In this step (S20), with reference to FIG. 5, argon (Ar) gas, which is a carrier gas, is first supplied to the inside of crucible 2. Then, a heating coil (not shown) or the like is employed to heat the inside of crucible 2 to a temperature of not less than 2000° C. and not more than 2500° C. In doing so, the inside of crucible 2 is heated such that the temperature is decreased in a direction from the side at which source material 12 is provided to the side at which seed substrate 11 is provided (such that a temperature gradient is formed).

Next, a crystal growth step is performed as a step (S30). In this step (S30), pressure in crucible 2 is decreased to a predetermined pressure while supplying the argon gas. Accordingly, source material 12 is sublimated to produce a source material gas of silicon carbide and the source material gas is solidified on seed substrate 11, thereby growing silicon carbide layer 13. Moreover, nitrogen gas, which is a dopant gas, is also supplied to the inside of crucible 2 together with the argon gas. Then, the nitrogen gas is thermally decomposed to produce nitrogen atoms, which are then incorporated as a dopant in silicon carbide layer 13 that is being grown. By sublimating source material 12 while supplying the nitrogen gas and the argon gas in the step (S30) in this way, silicon carbide layer 13 including the nitrogen atoms is grown on surface 11a of seed substrate 11. By performing the steps (S10) to (S30), silicon carbide ingot 1 is prepared.

Next, a cutting step is performed as a step (S40). In this step (S40), with reference to FIG. 6, silicon carbide ingot 1 is cut by a predetermined thickness using a wire saw 3. Accordingly, a plurality of silicon carbide substrates 10 (FIG. 2) each having the predetermined thickness is obtained from silicon carbide ingot 1. First, the structure of wire saw 3 will be described with reference to FIG. 6.

Wire saw 3 mainly has a jig 30 (a main body portion 31 and a holding portion 32), a set of rollers 33, a wire 34, and a cutting fluid supplying unit 35. Each of rollers 33 has a cylindrical shape, and rollers 33 are arranged side by side with a predetermined space interposed between roller 33 and the other roller 33. Each of rollers 33 is rotatable around the center axis of the cylindrical shape as indicated by arrows in FIG. 6.

Wire 34 is an electrodeposition diamond wire, which is a piano wire or the like having a surface to which diamond abrasive grains are fixed by electrodeposition, for example. The diameter of wire 34 is 250 μm, for example. Wire 34 is wound a plurality of times around the outer circumferential surface of each of the set of rollers 33 as shown in FIG. 6. The tension of wire 34 is 45N, for example. Accordingly, wire 34 is permitted to travel from an upstream side U (left side in FIG. 6) to a downstream side D (right side in FIG. 6) while reciprocating between one roller 33 and the other roller 33.

Cutting fluid supplying unit 35 is provided above wire 34. Cutting fluid supplying unit 35 supplies cutting fluid (coolant) from above wire 34.

Jig 30 includes main body portion 31 and holding portion 32, and holding portion 32 holds silicon carbide ingot 1 to be cut. Jig 30 can be moved in a direction to come close to wire 34 or a direction to get away from wire 34 while holding silicon carbide ingot 1 in holding portion 32.

Next, the following describes a procedure of cutting silicon carbide ingot 1 using wire saw 3. With reference to FIG. 6, first, silicon carbide ingot 1 prepared in the steps (S10) to (S30) is installed in jig 30 to bring a portion of the outer circumferential surface of silicon carbide ingot 1 into contact with holding portion 32. On this occasion, silicon carbide ingot 1 is installed such that a portion of silicon carbide ingot 1 at the end surface 1b side with a relatively high nitrogen concentration is located at downstream side D of wire 34 (right side in FIG. 6) and a portion of silicon carbide ingot 1 at the end surface 1a side with a relatively low nitrogen concentration is located at upstream side U of wire 34 (left side in FIG. 6).

Next, by rotating rollers 33, wire 34 travels from upstream side U (left side in FIG. 6) to downstream side D (right side in FIG. 6) while reciprocating between rollers 33. Accordingly, wire 34 travels in the growth direction of silicon carbide ingot 1 (direction in which end surface 1a and end surface 1b face each other). The average value of the linear speed (travel speed) of wire 34 is 1000 m/min, for example.

Next, jig 30 is lowered to the wire 34 side, thereby bringing silicon carbide ingot 1 into contact with wire 34. On this occasion, silicon carbide ingot 1 is in contact with wire 34 at a plurality of cut portions lined up in the growth direction since wire 34 is provided to reciprocate between rollers 33. Here, a space between the cut portions in silicon carbide ingot 1 corresponds to a space between lines of wire 34 extending between rollers 33. Moreover, silicon carbide ingot 1 is installed such that the end surface 1b side with a relatively high nitrogen concentration is located at downstream side D of wire 34 and the end surface 1a side with a relatively low nitrogen concentration is located at upstream U of wire 34 as described above. Accordingly, the portion (second cut portion) of silicon carbide ingot 1 at the end surface 1b side among the plurality of cut portions is brought into contact with wire 34 at the downstream side in the travel direction as compared with the portion (first cut portion) of silicon carbide ingot 1 at the end surface 1a side among the plurality of cut portions.

Next, wire 34 is caused to travel from upstream side U to downstream side D in contact with silicon carbide ingot 1 at the plurality of cut portions lined up in the growth direction and silicon carbide ingot 1 is further lowered to attain progress in the cutting. The average value of the cutting speed is 250 μm/min, for example. Accordingly, silicon carbide ingot 1 is cut at the plurality of cut portions, thereby obtaining a plurality of silicon carbide substrates 10 (FIG. 2). The thickness of each of silicon carbide substrates 10 is not more than 1 mm, for example. By performing the steps (S10) to (S40) described above, silicon carbide ingot 1 (FIG. 1) and silicon carbide substrate 10 (FIG. 2) according to the present embodiment are obtained, thus completing the method for manufacturing the silicon carbide ingot and the silicon carbide substrate according to the present embodiment.

Example

An experiment was conducted to confirm an effect of the present invention with regard to suppression of warpage of a substrate when cutting a silicon carbide ingot using a wire saw according to the fixed abrasive grain method. First, the silicon carbide ingot according to the present embodiment was prepared. In the silicon carbide ingot, nitrogen concentrations at first measurement point 21 and second measurement point 22 (FIG. 3) were respectively $8.72 \times 10^{17}$ cm$^{-3}$ and $8.20 \times 10^{17}$ cm$^{-3}$ (Example). Meanwhile, as a Comparative Example, a silicon carbide ingot was also prepared in which nitrogen concentrations at first measurement point 21 and second measurement point 22 were respectively $8.05 \times 10^{17}$ cm$^{-3}$ and $8.03 \times 10^{17}$ cm$^{-3}$. Each of the silicon carbide ingots of the Example and the Comparative Example had a thickness of 10 mm. These silicon carbide ingots were then cut in the same manner as in the method for manufacturing the silicon carbide substrate according to the present embodiment. Accordingly, a plurality of silicon carbide substrates each having a thickness of 1 mm were obtained, and the warpage of each silicon carbide substrate was measured. Table 1 shows the results of measurements of the warpages in the Example (No. 1 to No. 9) and the Comparative Example (No. 10 to No. 18). It should be noted that in Table 1, the numbers (No.) of the silicon carbide substrates are given in order in the growth direction of the silicon carbide ingot: the silicon carbide substrates of No. 1 and No. 10 are substrates obtained by cutting the seed substrate side; and the silicon carbide substrates of No. 9 and No. 18 are substrates obtained by cutting the growth surface side. In other words, silicon carbide substrates given numbers close to No. 1 and No. 10 are substrates obtained through cutting by the upstream side of the wire whereas silicon carbide substrates given numbers close to No. 9 and No. 18 are substrates obtained through cutting by the downstream side of the wire.

TABLE 1

| Silicon Carbide Substrate | Warpage (SORI) (μm) |
|---|---|
| No. 1 | 20.546 |
| No. 2 | 22.81 |
| No. 3 | 20.55 |
| No. 4 | 21.22 |
| No. 5 | 20.23 |
| No. 6 | 22.52 |
| No. 7 | 24.25 |
| No. 8 | 26.12 |
| No. 9 | 24.25 |
| No. 10 | 20.546 |
| No. 11 | 22.81 |
| No. 12 | 19.862 |
| No. 13 | 25.134 |
| No. 14 | 30.497 |
| No. 15 | 33.523 |
| No. 16 | 34.031 |
| No. 17 | 38.037 |
| No. 18 | 49.909 |

As apparent from Table 1, in the Comparative Example (No. 10 to No. 18), the warpage of each of the substrates obtained through the cutting by the downstream side of the wire (substrates given numbers close to No. 18) was greatly increased as compared with the warpage of each of the substrates obtained through the cutting by the upstream side of the wire (substrates given numbers close to No. 10); however, in the Example (No. 1 to No. 9), an increase in warpage was smaller than that in the Comparative Example. Hence, it was found that by controlling the gradient of the nitrogen concentration in the growth direction of the silicon carbide ingot, it is possible to suppress the warpage of a substrate when cutting it by way of the fixed abrasive grain method.

The embodiments and examples disclosed herein are illustrative and non-restrictive in any respect. The scope of the present invention is defined by the terms of the claims, rather than the embodiments described above, and is intended to include any modifications within the scope and meaning equivalent to the terms of the claims.

INDUSTRIAL APPLICABILITY

The silicon carbide ingot and the method for manufacturing the silicon carbide substrate in the present invention can be applied particularly advantageously to a silicon carbide ingot required to allow for suppression of warpage of a substrate when cutting it using a wire saw according to the fixed abrasive grain method, as well as a method for manufacturing a silicon carbide substrate using the silicon carbide ingot.

REFERENCE SIGNS LIST

1: silicon carbide ingot; 1a, 1b: end surface; 2: crucible; 3: wire saw; 10: silicon carbide substrate; 11: seed substrate; 11a: surface; 12: source material; 13: silicon carbide layer; 21: first measurement point; 22: second measurement point; 30: jig; 31: main body portion; 32: holding portion; 33: roller; 34: wire; 35: cutting fluid supplying unit.

The invention claimed is:

1. A silicon carbide ingot comprising a first end surface and a second end surface opposite to the first end surface,
the first end surface and the second end surface facing each other in a growth direction, the growth direction extending from the first end surface to the second end surface, a gradient of a nitrogen concentration in the growth direction being not less than $1\times10^{16}$ cm$^{-4}$ and not more than $1\times10^{18}$ cm$^{-4}$, the first end surface being a (0001) plane, the second end surface being a (000-1) plane, the nitrogen concentration increasing along the growth direction from the first end surface to the second end surface.

2. The silicon carbide ingot according to claim 1, wherein the silicon carbide ingot has a width of not less than 100 mm when viewed in the growth direction.

3. The silicon carbide ingot according to claim 1, wherein the nitrogen concentration is changed monotonously in the growth direction.

4. The silicon carbide ingot according to claim 1, wherein the gradient of the nitrogen concentration in the growth direction linearly increases from the first end surface toward the second end surface.

5. A method for manufacturing a silicon carbide substrate comprising steps of:
preparing the silicon carbide ingot recited in claim 1; and
obtaining a silicon carbide substrate by cutting the silicon carbide ingot.

6. The method for manufacturing the silicon carbide substrate according to claim 5, wherein in the step of obtaining the silicon carbide substrate, the silicon carbide ingot is cut by causing a wire to travel in contact with the silicon carbide ingot at a plurality of cut portions lined up in the growth direction, the wire having a surface to which an abrasive grain is fixed.

7. The method for manufacturing the silicon carbide substrate according to claim 6, wherein
the nitrogen concentration in a portion of the silicon carbide ingot at the second end surface side is higher than the nitrogen concentration in a portion of the silicon carbide ingot at the first end surface side, and
a second cut portion located at the second end surface side among the plurality of cut portions is brought into contact with a portion of the wire at a downstream side in the travel direction as compared with a first cut portion located at the first end surface side among the plurality of cut portions.

8. The method for manufacturing the silicon carbide substrate according to claim 6, wherein the abrasive grain includes a diamond abrasive grain.

9. The method for manufacturing the silicon carbide substrate according to claim 5, wherein in the step of obtaining the silicon carbide substrate, the silicon carbide ingot is cut to provide the silicon carbide substrate with a thickness of not more than 1 mm.

\* \* \* \* \*